United States Patent [19]

Shimazu

[11] 4,416,164

[45] Nov. 22, 1983

[54] PUSH-BUTTON TYPE TUNING APPARATUS

[75] Inventor: Teruo Shimazu, Atsugi, Japan

[73] Assignee: Mitsumi Electric Company, Ltd., Tokyo, Japan

[21] Appl. No.: 235,054

[22] Filed: Feb. 17, 1981

[30] Foreign Application Priority Data

Jun. 17, 1980 [JP] Japan .................................. 55-84506

[51] Int. Cl.³ .......................... H03J 5/12; G05G 1/02
[52] U.S. Cl. ....................................... 74/10.33; 334/7
[58] Field of Search ........................... 74/10.33; 334/7

[56] References Cited

U.S. PATENT DOCUMENTS

| 4,133,214 | 1/1979 | Cicala | 74/10.33 |
| 4,191,058 | 3/1980 | Stamm | 74/10.33 |
| 4,299,132 | 11/1981 | Dellantonio | 74/10.33 |
| 4,331,038 | 5/1982 | Naoi | 74/10.33 |

Primary Examiner—Allan D. Herrmann
Attorney, Agent, or Firm—Ladas & Parry

[57] ABSTRACT

A push-button type tuning apparatus comprises a frame, a plurality of push-button assemblies each having a push-button on one end thereof, and inserted into and supported by the frame, where the push-button assembly is slidable in the pushing direction between a non-operational position and an operational position, a cam member provided on the frame, where the cam member is slidable in a direction perpendicular to the pushing direction of the push-button assembly, and a tuner provided on the frame, where the tuner is tuned according to the sliding quantity of the cam member. The push-button assembly further has a memory piece which has a V-shaped cam portion, where the memory piece is rotatably supported in the vicinity of the open portion of the V-shaped cam portion in a state in which the vertex of the V-shaped cam portion faces towards the direction of the push-button, and locking means for locking the memory piece at a desired rotated position. The cam member further has a projecting cam portion provided on the inner side of the V-shaped cam portion of the memory piece. Moreover, the V-shaped cam portion of the memory piece which is in the locked state, makes contact with and pushes against the projecting cam portion of the cam member upon sliding of the push-button assembly in the operational position, and guides the projecting cam portion to the vertex of the V-shaped cam portion to slide the cam member in the perpendicular direction with respect to the pushing direction of the push-button assembly.

8 Claims, 23 Drawing Figures

PUSH-BUTTON TYPE TUNING APPARATUS

BACKGROUND OF THE INVENTION

The present invention relates generally to push-button type tuning apparatuses, and more particularly to a push-button type tuning apparatus in which a V-shaped cam part is provided on a memory piece which is rotatably supported on a push-button assembly, and a projecting cam part is simply provided on a cam plate which is slidable in a direction perpendicular to the inserting direction of the push-button assembly, to increase the slidable range of the cam plate and improve the tuning accuracy, by urging the V-shaped cam part and the projecting cam part to mutually make contact with each other and restricting these V-shaped cam part and projecting cam part.

Generally, in a form of a push-button type tuning apparatus, a push-button assembly having a push-button plate and a sliding plate respectively assembled in a vertical state thereon, is pushed, and the memorizing and reading-out of the selected station is performed by urging a wedge-shaped memory piece rotatably supported on the sliding plate to make contact with a pair of shafts provided on a freely rotatable frame, and restricting the mutual relationship between the positions of the wedge-shaped memory piece and the above frame. In another form of a push-button type tuning apparatus, a push-button assembly having a push-button plate and a sliding plate respectively assembled in a horizontal state thereon, is pushed, and the memorizing and reading-out of the selected station is performed by urging a memory piece in a direction perpendicular to the direction of the above pushing of the push-button assembly to make contact with a cam plate provided freely slidable and horizontally, and restricting the mutual relationship between the positions of the memory piece and the cam plate. In the above described forms of push-button type tuning apparatuses, the former arranges the push-button plate and the sliding plate vertically, and hence, the thickness of the apparatus becomes large. Accordingly, the second form of push-button type tuning apparatus is frequently used these days because of its thin construction.

A push-button type tuning apparatus provided with a V-shaped cam part (the pitch of the V-shaped cam part in the left and right directions is designated by P) at a part, of the above cam plate which is freely slidable in the left and right directions, corresponding to each of the push-button assemblies, and performs the memorizing and reading-out of the selected station when the memory piece of the push-button assembly makes contact with the above V-shaped cam part, has been proposed as the above thin-type push-button type tuning apparatus. In this previously proposed apparatus, if the memorizing of a station is performed when the memory piece makes contact with a certain point on one side of the V-shape of the cam plate (at a point separated from the vertex of the V-shaped by a distance l1) and rotated, and the memory piece then makes contact with the other side of the V-shape of the cam plate (at a point separated from the vertex of the V-shape by a distance l2) upon reading-out of the selected station, the cam plate accordingly slides by a distance (l1+l2) in one move. When (l1+l2) is larger than P/2, the memory piece disengages from the corresponding V-shaped cam part upon reading-out of the selected station, and thus, the value (l1+l2) must be smaller than P/2. Accordingly, there was a disadvantage in that the tuning accuracy was easily degraded, since the maximum sliding quantity of the cam plate is limited to a relatively small quantity, mainly, P/2.

Furthermore, in the conventional push-button type tuning apparatus described above, the memory piece which is already locked, makes contact with the cam plate upon pushing in of the push-button assembly, and forcibly returns the cam plate into the position upon memorizing of the desired station. However, in this push-button type tuning apparatus of the above described construction, the cam plate must be slidable with a small load. Thus, normally, predetermined clutch changeover means is operated relative to the push-in operation of the push-button assembly, to put the clutch means between the cam plate and the manual tuning part in a non-transferring state, and put the cam plate in the above small load slidable state. But in this normal construction, the above clutch changeover means operates to put the cam plate in the small load slidable state even when the push-button assembly is pushed in upon reading-out of the selected station. Accordingly, there was a disadvantage in that the cam plate which is in advance positioned at a predetermined position by the manual tuning operation, is slightly displaced by shocks such as the shock exerted from the outside, and the shock introduced when the memory piece makes contact, to result in an incorrect memory operation by the memory piece.

SUMMARY OF THE INVENTION

Accordingly, a general object of the present invention is to provide a novel and useful push-button type tuning apparatus in which the above described problems have been eliminated.

Another and more specific object of the present invention is to provide a push-button type tuning apparatus in which a push-button plate and a sliding plate respectively placed one over another and assembled in a horizontal state, are separately restricted of their positions with respect to the frame upon pushing in of the assembled push-button plate and the sliding plate, to always perform the memorizing and the reading-out of the selected station at the identical position, so as to improve the tuning accuracy.

Another object of the invention is to provide a push-button type tuning apparatus in which a memory piece is normally restricted by a spring member so as to be in a rotating neutral position except for the time when the memory piece is locked, for example, so that the freely rotatable memory piece makes contact with a cam part of a cam plate with mutually small sloping angle when a push-button assembly is pushed in upon memorizing of a desired station, to prevent a large contact shock from being applied to a memory member and improve the tuning accuracy.

Still another object of the invention is to provide a push-button type tuning apparatus in which a memory piece or a V-shaped cam part of a cam plate is of a curved shape, to facilitate the sliding operation of the cam plate especially at a point where the memory piece begins to make contact, when a push-button is pushed to read-out and tune-in to the selected station.

Another object of the invention is to provide a push-button type tuning apparatus in which, upon memorizing of a desired station, a memory piece makes contact with a cam plate and is displaced, and clutch means changes over to a non-transferring state to put the cam plate in a small load slidable state for the first time, after the locking operation of the memory piece is started, and upon reading-out of the selected station, the clutch means is changed over to the non-transferring state before the memory piece makes contact with the cam plate, to put the cam plate in the desired small load slidable state.

Other objects and further features of the present invention will be apparent from the following detailed description when read in conjunction with the accompanying drawings.

BRIEF DESCRIPTION OF THE DRAWINGS

FIG. 1 is a perspective view showing the essential parts of a first embodiment of a push-button type tuning apparatus of the present invention, in a state before the push-button assembly is pushed in;

FIG. 2 is a perspective view showing the bottom part of the apparatus of FIG. 1 in a state before the push-button assembly is pushed in;

FIGS. 3A through 3C respectively are a perspective view, perspective view showing the bottom part, and vertical sectional view of the above push-button assembly, in a state after the push-button assembly is pushed in;

FIG. 10 is a perspective view showing the essential parts of a second embodiment of a push-button type tuning apparatus, in a state before the push-button assembly is pushed in;

FIGS. 11A and 11B respectively are a perspective view showing the bottom part, and a disassembled perspective view showing the essential part, of the push-button type tuning apparatus of FIG. 10 in a state before the push-button assembly is pushed in;

FIGS. 12A and 12B respectively are a perspective view showing the bottom part, and a vertical-sectional view, showing the push-button assembly shown in FIG. 10, in a state after the push-button assembly is pushed in;

DETAILED DESCRIPTION

A first embodiment of a push-button type tuning apparatus according to the present invention will now be described in conjunction with FIGS. 1 through 7.

Figures 1, 2:
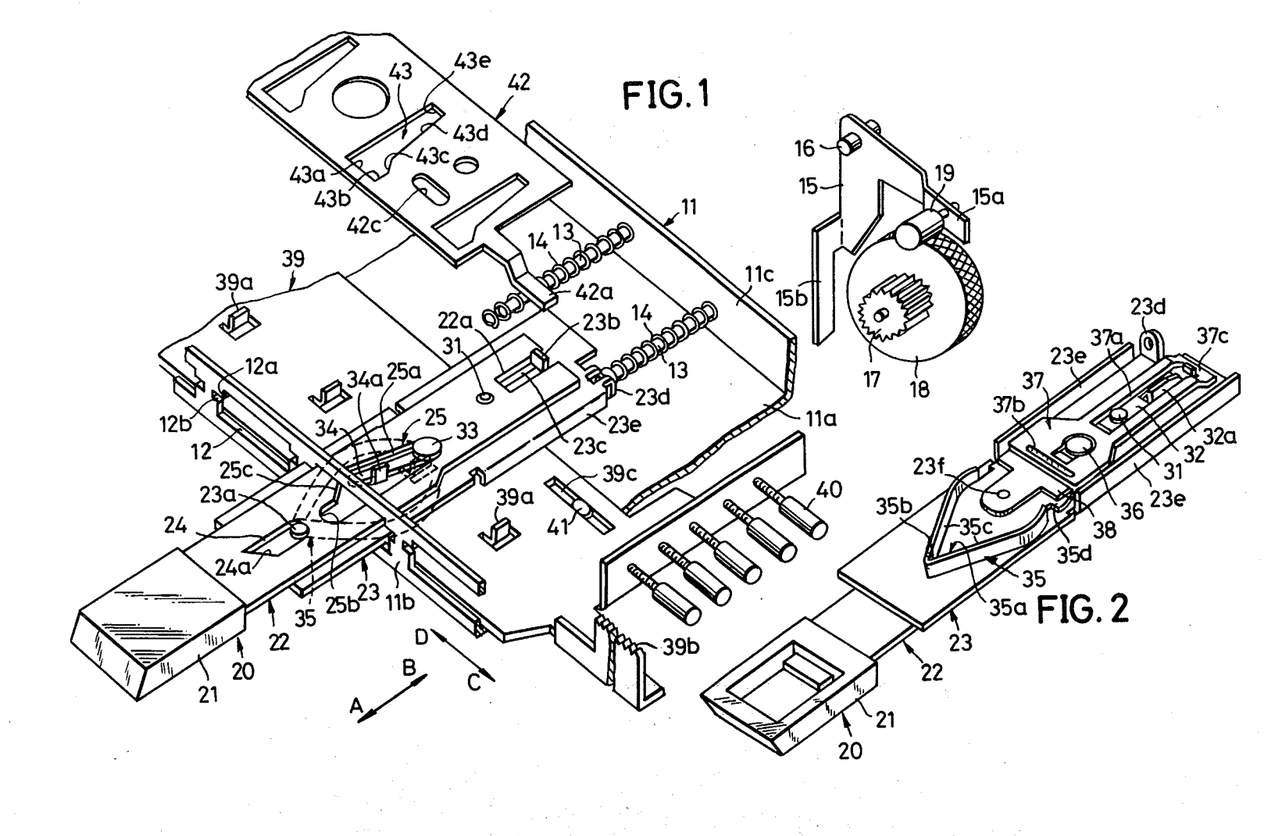

In FIG. 1, a frame bottom plate 11 has a front side plate 11b and a rear side plate 11c respectively bent and integrally formed on a bottom portion 11a. An opening 12 having a pair of supporting edges 12a and a pair of supporting grooves 12b respectively provided at the upper edge and in the intermediate position thereof, is formed in the front side plate 11b. Six such openings 12, for example, are formed in parallel at a pitch P in the front side plate 11b. In this case, six guide pins 13 which are respectively inserted into coil springs 14, are respectively embedded and provided at the pitch P in the corresponding positions of the rear side plate 11c. Moreover, as shown in FIG. 1, an arm 15 having ends 15a and 15b, urged in the clockwise direction and rotatably supported by a pin 16, is provided at a vertical plate portion (not shown) which is bent and formed and positioned in the lower right hand side position in FIG. 1, and a pinion 17 and a drum 18 are unitarily supported on the same shaft. The rotation of a manual tuning shaft is transferred to one end 15a of the arm 15, and this end 15a supports the shaft end of an universally movable roller 19. Thus, in a normal state, the roller 9 is pressed against the drum 18 by the above urging of the arm 15 in the clockwise direction, and the roller 19 and the drum 18 are in a rotation transmitting state.

Six push-button assemblies 20 are, for example, respectively provided within the openings 12 of the bottom plate 11 at the predetermined pitch P, and each of these push-button assemblies 20 substantially comprises a push-button 21, a push-button plate 22, and a sliding plate 23. These push-button 21 and push-button plate 22 are fixed unitarily. The push-button plate 22 is substantially of a long and narrow strip plate shape, as shown in FIGS. 1, 2, and 3A through 3C, and has a sloping edge opening 24 provided with a sloping edge 24a which is inclined with respect to directions shown by arrows C and D in FIG. 1. The push-button plate 22 also has a cam opening 25 which has depressions 25a and 25b and a sloping edge 25c, and a rear end cutout groove 22a. Furthermore, a locking cam plate 32 having a projection 32a is supported by a pin 31, at the rear end bottom of the push-button plate 22 as will be described later on.

Figures 3A, 3B:
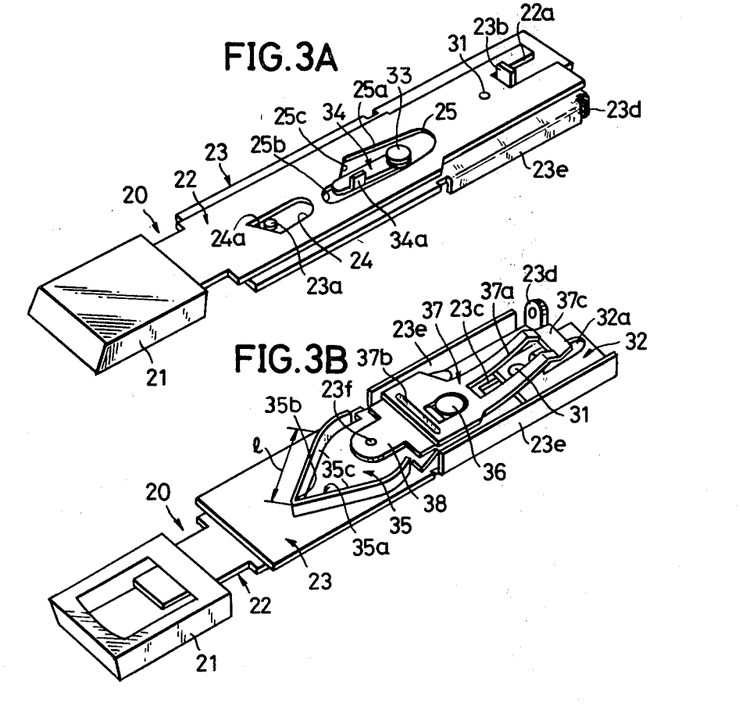
Figure 3C:
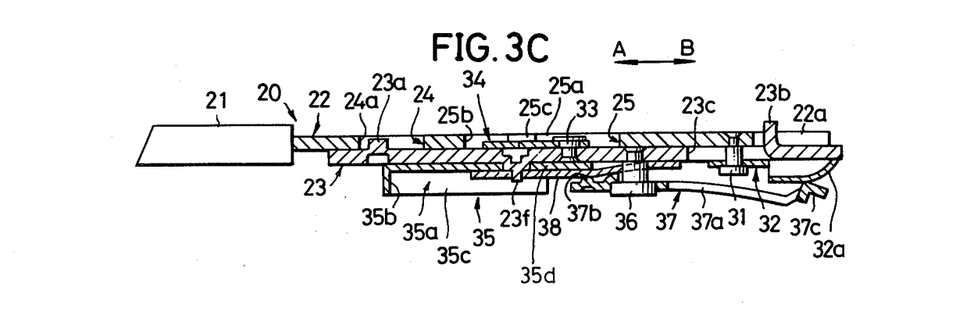
Figure 4:
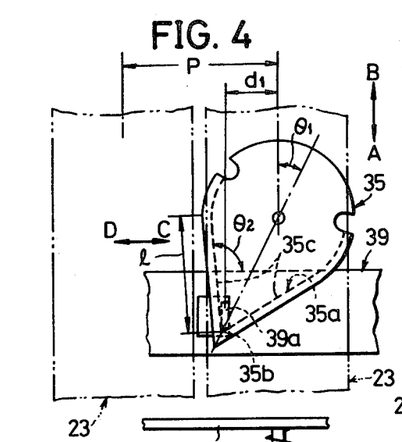
FIGS. 4 and 5 respectively are partial plan views showing the above push-button assembly in a final pushed-in state and a state halfway upon pushing in of the push-button assembly.

The sliding plate 23 is also substantially of a long and narrow strip plate shape, as shown in FIGS. 1, 2, and 3A through 3C. A projecting pin portion 23a and a cut-and-raised projecting portion 23b are formed unitarily on the upper surface of the sliding plate 23. In addition, a longitudinal opening 23c and an opening 23d are formed at the tip end of the sliding plate 23, and bent-and-formed projections 23e are respectively provided at the lower surface on both sides of the sliding plate 23, at the tip end thereof. A pin-shaped rotating member 34 having a projection 34a bent-and-formed thereof, is rotatably supported by a pin 33 on the upper surface of the sliding plate 23, and a memory piece 35 having a V-shaped wall is rotatably supported by a projected pin portion 23f on the lower surface of the sliding plate 23. A locking leaf spring 37 having a square opening 37a, a pushing projection 37b, and a bridge portion 37c, is supported by a pin 36. A leaf spring 38 provided between the memory piece 35 and the leaf spring 37, is arranged and positioned by the above pin portion 23f and the pin 36, and supports the memory piece 35. A V-shaped projecting portion 35a having a V-shaped vertex 35b, is bent-and-formed at the lower peripheral surface of the memory piece 35. Moreover, a pushed plate portion 35d of a semi-circular shape is formed at the rear end of the memory piece 35, in a position opposing the pushing projection 37b through the above leaf spring 38. As shown in FIG. 4, the V-shaped projecting portion 35a has a pair of linear wall portions 35c respectively having a length l.

The above push-button plate 22 is assembled on top, on the upper surface of the sliding plate 23. The projecting pin portion 23a is accommodated in the rear end position within the sloping edge opening 24, and the rotating member 34 is accommodated in the rear end position within the cam opening 25. The projecting portion 23b is inserted into the cutout groove 22a. On the other hand, the pin 31 which passes through the locking cam plate 32, also passes through the longitudinal opening 23c of the sliding plate 23, and is fixed to the push-button plate 22. Accordingly, the push-button assembly 20 is formed by assembling the push-button plate 22 and the sliding plate 23 in the above described manner. Further, the projection 32a of the locking cam plate 22 is accommodated within the opening 37a of the locking leaf spring 37. Therefore, even though these locking cam plate 32 and locking leaf spring 37 are supported by pins, they are restricted of their movements by parts such as the projections 23e provided on both sides of the sliding plate, and do not rotate.

Both sides of the push-button plate 22 of the push-button assembly 20, are inserted between a pair of supporting edges 12a with respect to one opening 12 provided in the front side plate 11b of the frame bottom plate 11, as shown in FIG. 1. On the other hand, both sides of the sliding plate 23 are inserted between the pair of supporting grooves 12b. The opening 23d provided at the tip end of the push-button assembly 20, has the guide pin 13 inserted therein, and is supported freely slidable in the directions shown by arrows A and B in FIG. 1. Normally, the opening 23d is urged in the direction of the arrow A by the coil spring 14, and stopped at a position where the projecting portion 23b makes contact with a stopping part (not shown) provided on the frame upper plate. The projection 34a of the rotating member 34 is positioned inside a depression 43b of a cam opening 43 provided in a clutch lever plate 42 which will be described later on, as shown in FIG. 4.

Six cam projecting portions 39a are cut-and-raised and formed in parallel at the predetermined pitch P in a cam plate 39, along the left and right hand side directions as shown in FIG. 1. A rack 39b is formed at one bent portion formed at the right end of the cam plate 39, and a plurality of cores 40 are screwed in and fixed to the other bent portion formed at the right end of the cam plate 39. A pair of longitudinal openings 39c provided in the cam plate 39 are respectively fitted with a pair of guide pins 41 therein, and thus, the cam plate 39 is freely slidable in the directions of the arrows C and D on the bottom portion 11a of the frame bottom plate 11. Normally, the cam plate 39 is in a neutral position, and the cam projecting portions 39a are respectively provided opposing and separated from each other below the pushed-up plate portion 35d of the memory piece 35, and positioned at corresponding positions with respect ot each of the push-button assemblies 20. The rack 39b meshes with the above pinion 17, and each of the cores 40 are respectively freely movable in and out with respect to a plurality of coils (not shown) respectively fixed to the frame bottom plate 11.

Figure 6:
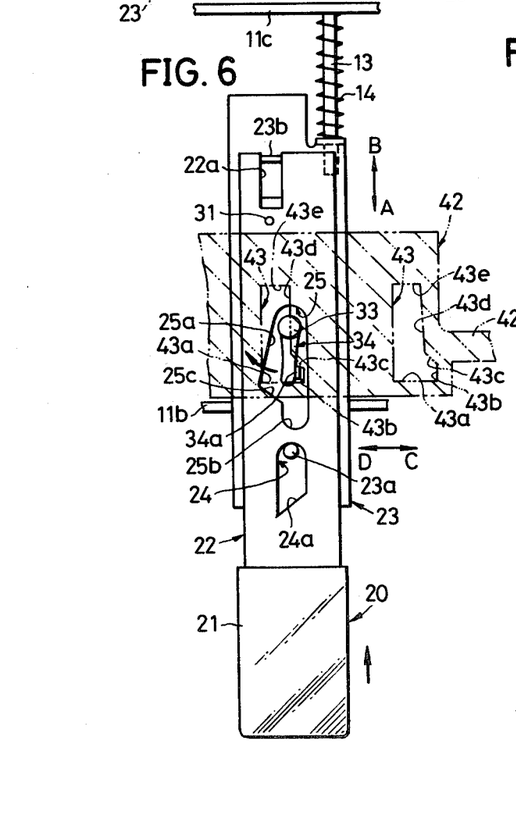
FIGS. 6 through 9 respectively are partial plan views showing the push-button assembly of the above push-button type tuning apparatus in a state before push-in, a state halfway upon push-in, a state upon final push-in, and a state returning from the final pushed-in state of the push-button assembly.

As shown in FIGS. 1 and 6, six cam openings 43 are formed in parallel at the predetermined pitch P in the clutch lever plate 42, along the left and right hand side directions. A projecting portion 42a is formed at the right end of the clutch lever plate 42. Furthermore, a pair of longitudinal openings 42c are fitted therein with a pair of guide pins (not shown) provided on the frame upper plate, with respect to the lower surface of the frame upper plate, so that the clutch lever plate 42 is mounted freely slidable in the directions shown by the arrows C and D in FIG. 1. The projection 34a of the rotating member 34 in each of the push-button assembly 20, enters into each respective cam openings 43.

The cam openings 43 respectively are boot-shaped, and has the depression 43b at one end of a front end edge 43a, a large sloping edge 43c and a small sloping edge 43d respectively having large and small sloping angles, and a rear end edge 43e. The clutch lever plate 42 normally is in a neutral position, and as shown in FIG. 6, the projection 34a of the rotating member 34 is positioned in the depression 43b of the cam opening 43. The projecting portion 42a of the clutch lever plate 42 is positioned opposing the end 15b and the arm 15.

Next, the operation of the push-button type tuning apparatus of the above described construction, will be described. First, when the manual tuning shaft (not shown) is rotationally operated to rotate the roller 19 shown in FIG. 1, the drum 18 and the pinion 17 respectively rotate. Since the pinion 17 is meshed with the rack 39b, the cam plate 39 slides in the direction of the arrow C, for example, by a predetermined distance d1 (d1 is smaller than P/2) as shown in FIG. 4. The cam projecting portion 39a of the cam plate 39 also slides in the same direction by the distance d1, and moves very close to or makes contact with the left hand side linear wall portion 35c of the freely rotatable memory piece 35, and upon contact, the cam projecting portion 39a slightly rotates the memory piece 35 in the clockwise direction from a neutral position of rotary movement of the memory piece 35. Furthermore, the cores 40 moves in and out of the respective coils to tune in to the desired station.

In order to memorize the above desired station, the respective push-button assembly 20 is pushed in against the coil spring 14 in the direction of the arrow B by operating a predetermined push-button 21, as shown in FIGS. 1 and 6. Then, since the rear end portion of the locking cam plate 32 makes contact with the bridge portion 37c of the locking leaf spring 37, the force applied to the push-button plate 22 in the direction of the arrow B is also transferred to the sliding plate 23. Accordingly, the push-button plate 22 and the sliding plate 23 substantially slide unitarily in the direction of the arrow B. Thus, the left hand side linear wall portion 35c of the memory piece 35 makes contact with the cam projecting portion 39a, and the memory piece 35 is successively rotated in the clockwise direction due to the restriction by the cam projecting portion 39a. The cam projecting portion 39a is relatively guided along the linear wall portion 35c, and makes contact with the V-shaped vertex 35b as shown in FIG. 4.

Accordingly, the memory piece 35 rotates in the clockwise direction by an angle $\theta_1$ from the neutral position of rotary movement, however, an angle $\theta_2$ formed between the left hand side linear wall portion 35c and the directions along the arrows C and D in FIG.

4 must be larger than 90 degrees. Moreover, in the case where the cam projecting portion 39a makes contact with the left hand side linear wall portion 35d in advance, the memory piece 35 starts rotating when the push-button assembly 20 is pushed in. The sliding motion of the push-button assembly 20 is stopped by the contact between the above cam projecting portion 39a and the V-shaped vertex 35b, and the tip end of the sliding plate 23 moves near to an opposing position with the rear side plate 11c.

Figure 7:
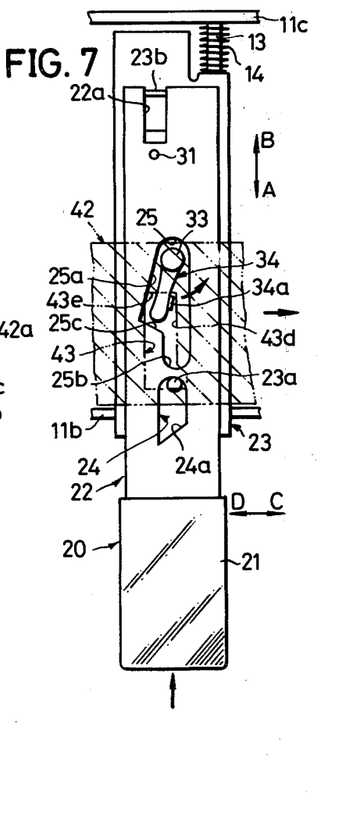

The rotating member 34 also moves in the direction of the arrow B from the position shown in FIG. 6. First, the projection 34a makes contact with the large sloping edge 43c of the cam opening 43 in the clutch lever plate 42, and is guided along this large sloping edge 43c, and then guided along the small sloping edge 43d. Hence, the rotating member 34 is successively rotated and displaced in the clockwise direction in FIG. 6, and as shown in FIG. 7, the tip end of the rotating member 34 is accommodated within the depression 25a of the cam opening 25 in the push-button plate 22. The reason this rotating member 34 rotates is because the rotating load of the rotating member 34 is smaller than the sliding load of the clutch lever plate 42. When the cam projecting portion 39a makes contact with the V-shaped vertex 35b of the above memory piece 35, the projection 34a of the rotating member 34 shown in FIG. 7 is near and in a position opposing the rear end edge 43e of the cam opening 43.

Figure 8:
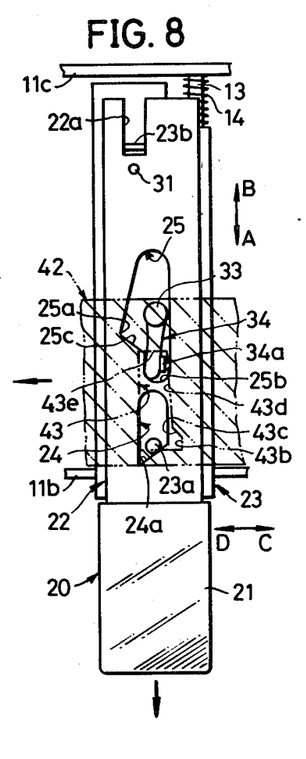

In FIG. 7, when the push-button 21 is pushed in even further, only the push-button plate 22 starts to slide in the direction of the arrow B being guided by the rear end cutout groove 22a and the projecting portion 23b, with respect to the sliding plate 23 stopped as described above. Therefore, as shown in FIG. 8, the projecting pin portion 23a relatively moves to the front from the rear position within the sloping edge opening 24, and is stopped after the projecting pin portion 23a slides a predetermined distance until making contact with the sloping edge 24a. When the push-button plate 22 starts to slide, the projection 32a of the locking arm plate 32 squeezes in between the bridge portion 37c of the locking leaf spring 37 and the sliding plate 23, and moves the above predetermined distance as shown in FIGS. 3B and 3C, to elastically deform the leaf spring 37 in the lower direction. Accordingly, the pushing projection 37b of the locking leaf spring 37 pushes against the pushed plate portion 35d of the memory piece 35 through the leaf spring 38, and clamps the memory piece 35 at a position rotated by the angle $\theta 1$ as shown in FIG. 4.

When the push-button plate 22 starts to slide from the position shown in FIG. 7 and moves a slight distance, the cam opening 25 moves in the direction of the arrow B relatively with respect to the rotating member 34 therein, and moves even further in the direction of the arrow B after the sloping edge 25c makes contact with the tip end of the rotating member 34. Accordingly, the tip end portion of the rotating member 34 is guided by the above sloping edge 25c in a sliding manner, and starts to rotate in an anti-clockwise direction. Moreover, the rotating member 34 enters within the depression 25b, and as shown in FIG. 8, the tip end portion of the rotating member 34 finally moves near into a position opposing the innermost part of the depression 25b. Hence, upon the above forced rotation in the anti-clockwise direction, the projection 34a of the rotating member 34 pushes against the small sloping edge 43d of the cam opening 43 in the clutch lever plate 42 in the direction of the arrow C. Thus, the clutch lever plate 42 slides in the direction of the arrow C by a slight distance from the position shown in FIG. 7 to the position shown in FIG. 8. Since the projecting portion 42a makes contact with and pushes against the end 15b of the arm 15, the arm 15 is rotated in the anti-clockwise direction in FIG. 1 against the spring, and pulls up one end 15a of the roller 19 to separate the roller 19 from the drum 18. Accordingly, the load on the manual tuning shaft side due to the roller 19 and the like, is separated from the cam plate 39, and hence, the cam plate 39 is put in a small load slidable state.

However, the reason the above cam plate 39 is put in a small load slidable state when the push-button assembly 20 is pushed in, is to enable the cam plate 39 to be easily displaced in a sliding manner upon reading-out of the selected station which will be described later on, and it is undesirable to put the cam plate 39 in a small load slidable state upon memorizing. Thus, in the present embodiment, by use of a construction shown in FIG. 7, the projection 32a of the locking cam plate 32 is squeezed into the upper surface of the bridge portion 37c of the locking leaf spring 37 and moved, while only the push-button plate 22 is pushed in and the rotating member 34 moves a slight distance until the tip end thereof makes contact with the sloping edge 25c of the cam opening 25, that is, while the clutch lever plate 42 does not slide, to lightly clamp the memory piece 35 at a position rotated by the above angle $\theta 1$.

Accordingly, from then on, since the cam plate 39 (cam projecting portion 39a) is in a small load slidable state, the memory piece 35 is clamped at the original position rotated by the angle $\theta 1$ independent of the cam plate 39 (cam projecting portion 39a) even when a shock such as a shock from the exterior or a shock upon pushing in of the push-button plate 22 is applied, and the desired station can be accurately be memorized.

When the push-button assembly 20 is in a final pushed-in state as shown in FIG. 8, the sloping edge 24a of the sloping edge opening 24 is pushed against the projecting pin portion 23a as described above, and thus, by the slope effect of the above, the push-button plate 22 and the sliding plate 23 respectively receive forces in the right and left directions in FIG. 1. Accordingly, the right side surface of the push-button plate 22 is pressed against the right supporting edge 12a of the opening 12, and the left side surface of the sliding plate 23 is pressed against the left supporting grooves 12b, so that the push-button plate 22 and sliding plate 23 respectively are instates restricted of their positions. These states are identical to those upon repetitive pushing of the push-button assembly 20 into the final pushed-in state. Therefore, the error in the displacement of the memory piece 35, especially when accompanied by the repetitive pushing of the push-button assembly 20, is eliminated, and accurate memorizing and reading-out of the selected station can be performed.

Figure 9:
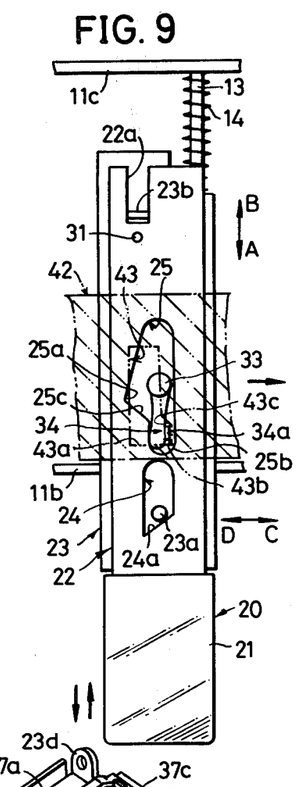

Next, when the pushing force on the push-button assembly 20 is released, the push-button assembly 20 returns toward the direction of the arrow A in a sliding manner due to the spring 14, from the position shown in FIG. 8. The push-button assembly 20 is stopped at a position where the projecting portion 23b makes contact with the stopping part on the frame upper plate, as shown in FIG. 9. The clutch lever plate 42 is urged in the direction of the arrow D by the rotational urging force of the arm 15, and successively guided relatively through the small sloping edge 43d and the large sloping edge 43c of the cam opening 43 in a sliding manner by the projection 34a of the rotating member 34. Accordingly, the clutch lever plate 42 returns toward the direction of the arrow D in a sliding manner, and reaches a position shown in FIG. 9 (identical position as in FIG. 6). Moreover, the projection 34a returns and moves within the depression 43b of the cam opening 43. By the above condition that the angle θ2 must be larger than 90 degrees, the cam projecting portion 39a reaches the rear part of the memory piece 35 without interfering with the left hand side linear wall portion 35c.

Figure 5:
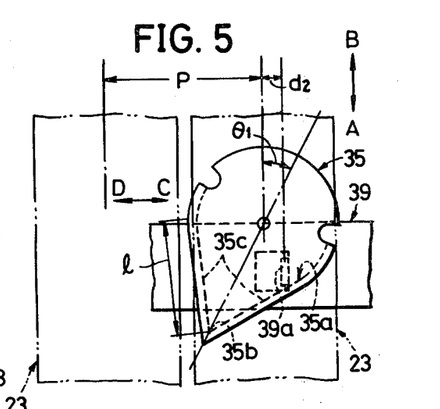

Next, the operation to read out the above selected station will now be described. In this case, it is assumed that a station other than that memorized above is selected at this point, and that the cam plate 39 has slid from the position shown in FIG. 4 in the direction of the arrow C, into a position where the cam projecting portion 39a has moved right from the neutral position by a distance d2 (where d2 is smaller than P/2) and relatively positioned on the right portion of the memory piece 35 as shown in FIG. 5. First, when the push-button assembly 20 is pushed in, in the direction of the arrow B from the position shown in FIG. 9, the push-button plate 22 and the sliding plate 23 respectively start to slide unitarily in the direction of the arrow B due to the clamping force of the above locking leaf spring 37.

Accordingly, the tip end of the rotating member 34 is inserted and accommodated within the depression 25b of the cam opening 25 and restricted so that it is not rotatable in the clockwise direction, and thus, the projection 34a immediately makes contact with and pushes against the large sloping edge 43c of the cam opening 43 in the clutch lever plate 42. Hence, the clutch lever plate 42 is successively and relatively guided through the large sloping edge 43c into a halfway position in the small sloping edge 43d in a sliding manner by the projection 34a. Because the clutch lever plate 42 is successively slid in the direction of the arrow C, the projecting portion 42a in FIG. 1 pushes against the end 15b of the arm 15. Therefore, the arm 15 rotates in the anticlockwise direction as in the case upon memorizing of the desired station, and the roller 19 and the drum 18 separate from each other. The cam plate 39 is thus separated of its link with the manual tuning part, and is put in a small load slidable state.

Accompanied by the pushing in of the push-button assembly 20, the right hand side linear wall portion 35c of the V-shaped projecting portion 35a in the memory piece 35 which is clamped at a position rotated by the above angle θ1 a as shown in FIG. 5, makes contact with the cam projecting portion 39a of the cam plate 39 positioned at a position corresponding to the above other station, at a certain halfway point where the projection 34a of the rotating member 34 slides and makes contact with the small sloping edge 43d of the cam opening 43. Thus, the cam projection portion 39a is guided along the right hand side linear wall portion 35c in a sliding manner and then enters to make contact with the V-shaped vertex 35b as shown in FIG. 4, since the cam plate 39 is in a small load slidable state as described above.

The cam plate 39 accordingly slides from the position shown in FIG. 5 to the position shown in FIG. 4 in the direction of the arrow D by a distance (d1+d2), and stops when returned to the same position as that upon the above memorizing of the desired station, as shown in FIG. 4. The projection 34a of the rotating member 34 successively slides against the small sloping edge 43d of the above cam opening 43 from the halfway position to the innermost part thereof, and slides the clutch lever plate 42 even further by a slight distance along the direction of the arrow C, to move near the rear end edge 43e of the cam opening 43 and return to the same state as that in FIG. 8.

As clearly understood from the above described construction and operation, in FIGS. 4 and 5, the maximum values of the distances d1 and d2 respectively are values obtained by subtracting the sum of the thickness of the linear wall portion 35c of the memory piece 35 and half the thickness of the cam projecting portion 39a from the value P/2. Thus, if the width of the memory piece 35 in the left and right is set at the maximum value P, and the thicknesses of the linear wall portion 35c and the cam projecting portion 39a is varied towards zero disregarding the problem concerning the strength of these parts, the maximum values of the distances d1 and d2 respectively vary towards the value P/2. Accordingly, it is possible to vary the sliding distance (d1+d2) of the cam plate 39 upon the above reading-out of the selected station towards the pitch P (that is, (d1+d2) is smaller than P), for example, and theoretically, the tuning accuracy can be improved by setting the sliding distance to approximately almost two times that of the conventional apparatus, and setting all the stations so that they correspond to the above set distance.

Moreover, when the push-button assembly 20 is in a final pushed-in state, the push-button plate 22 is pushed so that the push-button plate 22 relatively slides in the direction of the arrow B with respect to the sliding plate 23, and hence, the projecting pin portion 23a and the sloping edge 24a of the sloping edge opening 24 are hit and pushed by the push-button plate 22. Therefore, as in the case described above, the push-button plate 22 and the sliding plate 23 are restricted of their positions and respectively pushed in the right and left hand side directions in FIG. 1 due to the slope effect, and the memory piece 35 and the cam plate 39 are respectively returned accurately to the identical positions as those upon memorizing of the desired station.

Next, when the pushing force on the push-button assembly 20 is released, the push-button assembly 20 slides to return from the position shown in FIG. 8 along the direction of the arrow A, due to the spring 14. The memory piece 35 separates from the cam projecting portion 39a of the cam plate 39. Hence, the projecting portion 23b returns to again make contact with the stopping part provided on the frame upper plate, and this state is shown in FIG. 9. At this stage, the clutch lever plate 42 is relatively guided within the cam opening 43 in a sliding manner by the projection 34a of the rotating member 34, and returns in a sliding manner along the direction of the arrow D to reach a position shown in FIG. 9. Thus, the roller 19 presses against the drum 18.

The reading-out operation is thus completed, and the cam plate 39 is accurately returned to the same position as that upon memorizing in a sliding manner, due to the restriction by the memory piece 35 as described above. Accordingly, the desired station which was memorized can be accurately read out and tuned in to, when the cores 40 move in and out from the corresponding coils.

In order to tune in to and memorize still another station by rotationally operating the manual tuning shaft to slide the cam plate 39, the push-button 21 is pulled in the direction of the arrow A in a state shown in FIG. 9.

Then, the push-button plate 22 also slides relatively in the direction of the arrow A by a predetermined distance relative to the stationary sliding plate 23. Hence, the pin 31 which supports the locking cam plate 32, makes contact with the front end of the longitudinal opening 23c of the sliding plate 23 and stops when it reaches a position shown in FIG. 6. At the same time, the projection 32a of the locking cam plate 32 slips out from the bridge portion 37c of the locking leaf spring 37 to change from a state shown in FIGS. 3B and 3C into a state shown in FIG. 2, to return the leaf spring 37 into the original state by elastically deforming the leaf spring 37. Accordingly, the pushing force on the pushing projection 37b is released, and the memory piece 35 is released from the clamping to become free.

Since the cam opening 25 and the sloping edge opening 24 respectively slide in the direction of the arrow A by the above predetermined distance, the rotating member 34 moves and returns to a position at the rear within the cam opening 25 without rotating, and the projecting pin portion 23a moves and returns to a position at the rear within the sloping edge opening 24. Therefore, the push-button assembly 20 returns to its initial state as shown in FIG. 6. The above still another station can be selected and tuned in to by once again pushing the push-button assembly 20 in the manner described above.

Furthermore, in the present embodiment of the invention, the rotating member 34 supported on the sliding plate 23 is accommodated within the cam opening 25 provided in the push-button plate 22. However, without limiting to the above construction, the apparatus can be constructed in which a rotating member supported on the push-button plate 22 is accommodated within a cam opening provided in the sliding plate 23, and the above clutch lever plate 42 is operated.

In addition, the guiding of the push-button plate 22 and the sliding plate 23 upon relative sliding of these two plates, are performed by the cutout groove 22a of the push-button plate 22 and the projecting portion 23b of the sliding plate 23, in the present embodiment of the invention. However, without limiting to the above, the above guiding upon sliding of the push-button plate and the sliding plate can be performed by providing a projection which projects downwards on the push-button plate 22, and providing a cutout groove in the sliding plate 23.

In the present embodiment of the invention, the push-button plate 22 and the sliding plate 23 respectively receive forces in opposite directions, due to the slope effect of the projecting pin portion 23a and the sloping edge 24a upon final pushed-in state of the push-button plate 22, and thus, the push-button plate 22 and the sliding plate 23 are separately pushed against the support opening edges of the frame, restricted of their positions. Accordingly, regardless of the repetitive push-in operation of the push-button assembly 20, the push-button assembly is always accurately restricted to the identical position. In addition, even though the cam plate 39 becomes of a small load slidable state due to the link separation of the clutch lever plate 42, and more likely to be displaced in error by outside force and the like, especially upon memorizing the desired station, the memory piece 35 is already restricted and displaced to the original position by the cam plate 39, and temporarily held by the locking leaf spring 37. Therefore, the memory piece 35 will never undergo erroneous displacement, and the memorizing and reading-out of a desired station can accurately be performed by the simple construction described above.

Figure 10:
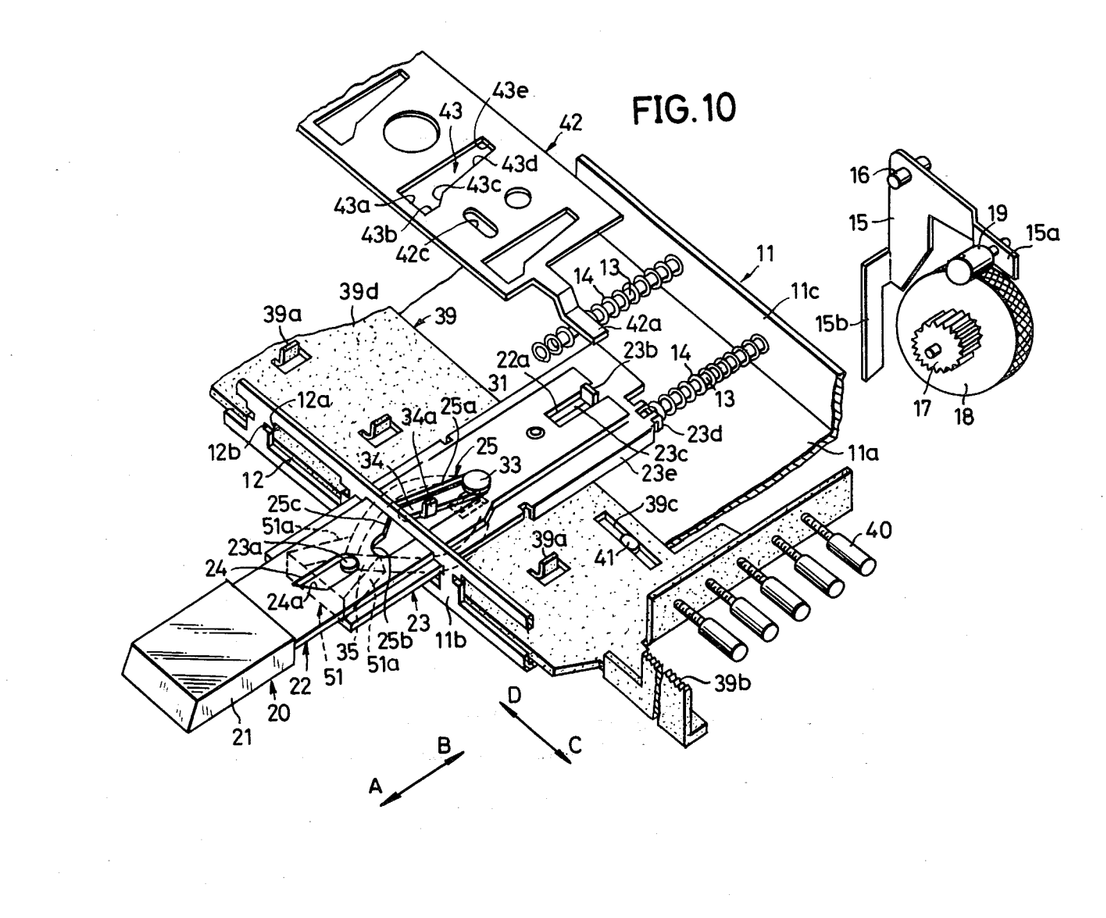

A second embodiment of a push-button type tuning apparatus will now be described in conjunction with FIGS. 10 through 12B. In FIG. 10, those parts which are the same as those corresponding parts in FIGS. 1 and 2 will be designated by the like reference numerals, and their description will be omitted.

Figures 11A, 11B:
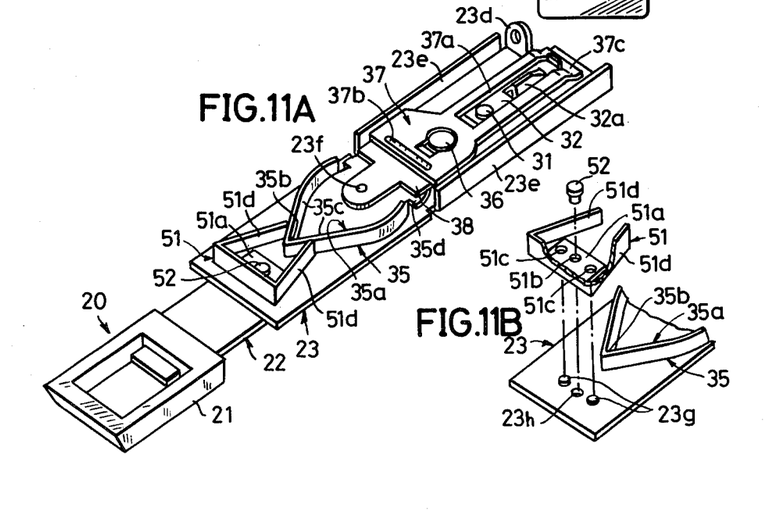

The differing points of present embodiment with respect to the above first embodiment is in that a copper film 39d formed by copper-plating, is formed on all surfaces of the cam plate 39 as shown by the shaded portion of FIG. 10, and that a restricting leaf spring 51 is fixedly mounted at the lower surface at the front end of the sliding plate 23 by a pin 52, as shown in FIGS. 11A and 11B. The above copper film 39d is provided to reduce the coefficient of friction between the cam plate 39 and the bottom portion 11a. As compared to the case where the copper film 39d is not provided, the sliding resistance is reduced by 15% to 20% in the present embodiment, and thus, the operation factor can be improved.

A mounting plate portion 51a is bent-and-formed at the rear side of the restricting leaf spring 51, and a pair of restricting spring poritions 51d are bent and provided at both sides of the restricting leaf spring 51 so that the tip ends of these restricting spring portions 51d close upon each other. The mounting plate portion 51a has a pin hole 51b and a pair of positioning holes 51c, as shown in FIG. 11B. In a state where projecting pin portions 23g respectively are fitted into the positioning holes 51c, the pin 52 is pressed into a hole 23h through the pin hole 51b, to fixedly mount the restricting leaf spring 51 as shown in FIG. 11B. The tip ends of the pair of restricting spring portions 51d press against the outer sides of the V-shaped projecting portion 35a of the memory piece 35 in the freely rotatable state, and holds and supports the memory piece 35 in the neutral position of rotary movement.

Next, the operation of the present embodiment of the invention will be described, however, the operations that are identical to those in the above first embodiment of the invention will be omitted, and only the differing operations will be described.

The differing point of the present embodiment of the invention upon memorizing a desired station as compared to that performed in the first embodiment of the invention is in that, when one inner side of the V-shaped projecting portion 35a of the memory piece 35 makes contact with the cam projecting portion 39a, the slopingangle of the above one inner side of the V-shaped projecting portion 35a with respect to directions of the arrows A and B is relatively small, since the memory piece 35 is in a neutral position of rotary movement due to the above restricting leaf spring 51. Accordingly, upon the above contact between one inner side of the V-shaped projecting portion 35a and the cam projecting portion 39a, the memory piece 35 gradually starts to rotate, applying hardly any shock to the cam projecting portion 39a, and thus, the cam plate 39 does not undergo erroneous displacement and has no bad effects on the tuning accuracy.

The operation to read out the above desired station, is performed in a similar manner as that in the first embodiment of the invention.

Figure 12A:
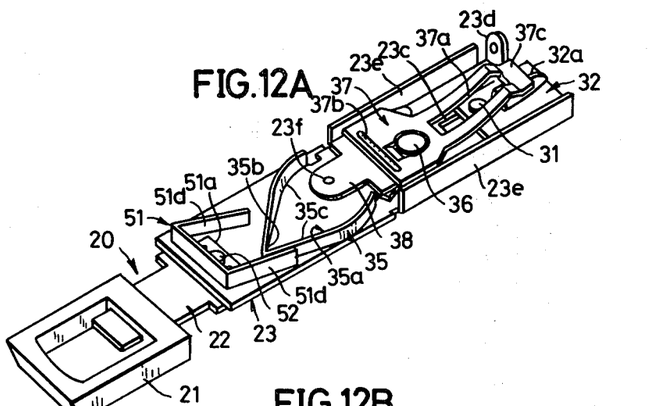
Figure 12B:
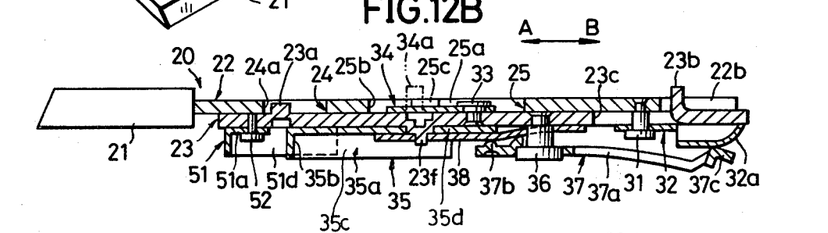

FIGS. 12A and 12B are a perspective view of the bottom part, and a vertical-sectional view, respectively showing the push-button assembly 20 after it is pushed in. In FIGS. 12A and 12B, those parts which are the same as those corresponding parts in FIGS. 3B and 3C are designated by the like reference numerals.

The differing point of the present embodiment of the invention from the above first embodiment upon selecting of still another station by sliding the push-button 21 alone in the direction of the arrow A in FIG. 9, is in that the memory piece 35 is rotationally returned in the clockwise direction in FIG. 12A by the spring force exerted by one of the restricting spring portions 51d of the restricting leaf spring 51, and automatically returned to the rotating neutral position shown in FIG. 11A. Accordingly, when pushing in the push-button assembly 20 again to tune in to and memorize a station, the memory piece 35 is always in the rotating neutral position due to the operation of the restricting leaf spring 51. Moreover, erroneous displacement is not introduced in the cam plate 39, since the memory piece 35 makes contact with the cam projecting portion 39a of the cam plate 39 so as not to apply shock, and is rotationally displaced.

In the present embodiment of the invention, the memory piece 35 having the V-shaped projecting portion 35a is restricted in the rotating neutral position by the restricting leaf spring 51 having the pair of restricting spring portions 51d, however, without limiting to the above construction, the above described construction can be used for maintaining and supporting the freely rotatable memory piece in the neutral position of rotary movement of the memory piece, in a push-button type tuning apparatus in which a memory piece makes contact with a pair of rotary shafts of a rotatable rotary member or a V-shaped cam surface of a slidable cam plate. Hence, the memory piece does not move unsteadily to introduce contact noise, and erroneous displacement is not introduced in the rotary member or the cam plate.

Furthermore, since a spring member for constantly and rotationally urging the memory piece in the neutral position of rotary movement of the memory piece, is provided at the push-button assembly, at a point in time before memorizing is performed, the freely rotatable memory piece is always restricted in the neutral position. In addition, when the push-button assembly is pushed in, the memory piece makes contact with the respective cam portion of the cam plate, and hardly transmits a contact shock to the cam plate by always starting to rotate at a relatively slow rotational speed. Accordingly, high tuning accuracy can be obtained, because hardly any erroneous displacement is introduced in the cam plate.

Figure 13:
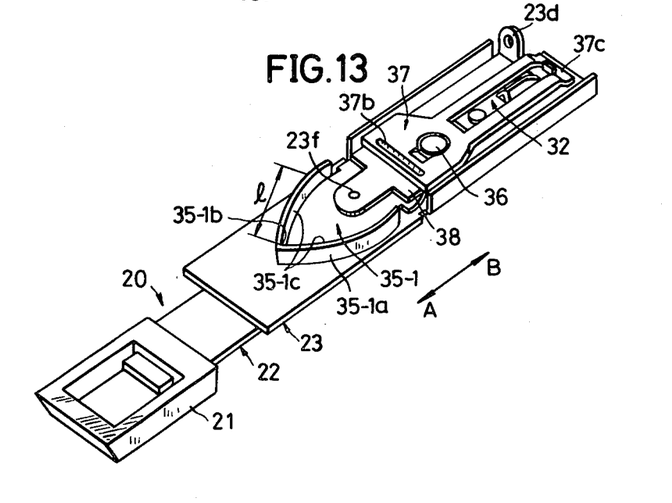
FIG. 13 is a perspective view showing the bottom part of a push-button assembly which is a part of a third embodiment of a push-button type tuning apparatus of the present invention.

Next, a third embodiment of a push-button type tuner according to the present invention will be described in conjunction with FIGS. 13 through 15. In FIG. 13, those parts which are the same as those corresponding parts in FIG. 3B will be designated by the like reference numerals and their description will be omitted.

In the present embodiment of the invention, the shape of a memory piece 35-1 has been devised, and the other parts are identical to those corresponding parts in the above first embodiment of the invention. Hence, the description of these identical parts will be omitted. A V-shaped projection 35-1a having a V-shaped vertex 35-1b is provided at the lower surface of the memory piece 35-1. A pair of curved wall portion 31-1c of the V-shaped projection 35-1a, are respectively formed in a curved manner having a range of the distance l which makes contact with the cam projecting portion 39a curved outwards.

Thus, upon finishing the memorizing operation of the desired station, assuming that the memory piece 35-1 is rotated by the predetermined angle $\theta 1$ and clamped as in the case shown in FIGS. 4 and 5, when the push-button assembly 20 is pushed in and the part relatively away from the vertex 35-1b of the curved wall portion 35-1c makes contact with the cam projecting portion 39a of the cam plate 39 positioned at a position corresponding to another station, the value of an angle $\theta 3$ formed between a tangent m at the contact point on the right hand side curved wall portion 35-1c and the directions along the arrows A and B, becomes smaller than the angle (not shown) formed when the same procedure is taken for the memory piece 35 and the linear wall portion 35c in FIG. 5.

Figure 14:
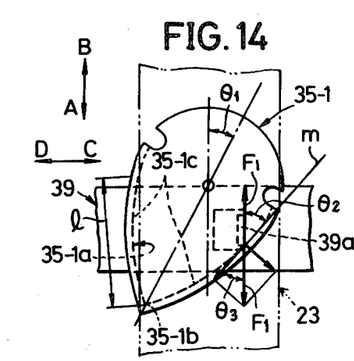
FIGS. 14 and 15 respectively are diagrams showing the operation of the memory piece and the cam plate of the push-button assembly.

Accordingly, when the pushing force of the push-button assembly 20 in FIG. 14 is designated by F1, the force which allows the sliding of the cam projecting portion 39a along the curve wall portion 35-1c is a partial force F2 of the opposing force F1 along the curve wall portion 35-1c, namely, $F1 \cos \theta 3$. Since the above angle $\theta 3$ is small, this partial force F2 becomes a relatively large force. Hence, although the static friction on the cam plate 39 is maximum upon starting of the sliding motion, the cam plate 39 starts to slide relatively easily along the curved wall portion 35-1c. Thus, the pushing force F1 of the push-button assembly 20 can be a relatively small force, facilitating the pushing operation, and accurate reading-out of the selected station can be performed without the memory piece 35-1 unnecessarily deviating and rotating.

Figure 15:
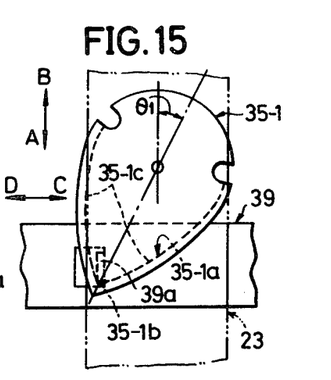

Moreover, when the cam projecting portion 39a slides along the curved wall portion 35-1c and comes close to the vertex 35-1b as shown in FIG. 15, the value of the angle $\theta 3$ is larger than that shown in FIG. 14, and thus, the value of the partial force F2 becomes small. However, the kinetic friction of the cam plate 39 in this case is small, since the cam plate 39 is performing a sliding operation. Furthermore, inertial force due to the pushing, acts in the vicinity of the final position of the push-in stroke by the push-button assembly 20. Therefore, the cam plate 39 can also be slid relatively easily along the curve wall portion 35-1c in this case.

Next, a fourth embodiment of a push-button type tuning apparatus according to the present invention will be described in conjunction with FIGS. 16A and 16B and FIGS. 17 and 18. Because the construction of the present embodiment of the invention is similar to the above embodiments, only the differing parts will be described and the description of the identical parts will be omitted.

Figure 16A:
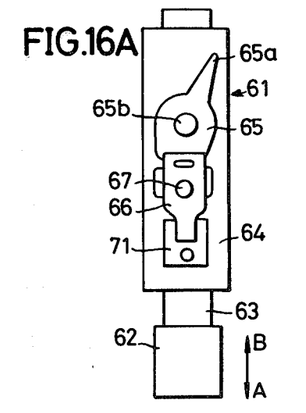
FIGS. 16A and 16B respectively are a bottom view and a vertical-sectional view showing a push-button assembly which is a part of a fourth embodiment of a push-button type tuning apparatus of the present invention.
Figure 16B:
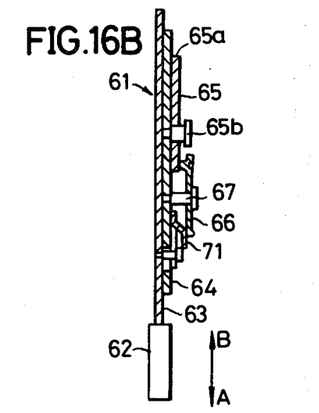

In FIGS. 16A and 16B, a push-button assembly 61 comprises a push-button plate 63 having a push-button 62 fixed thereto, and a sliding plate 64 which is freely slidable relatively with respect to the push-button plate 63. In addition, the push-button plate 63 comprises a locking cam plate 71. A memory piece 65 having a tip end contact portion 65a and supported by a pin 65b, and a locking leaf spring 66 which is supported by a pin 67, are respectively mounted on the sliding plate 64. Moreover, in FIGS. 16A and 16B, the push-button assembly 61 is shown in a state where the push-button plate 63 is relatively slid in the direction of the arrow B with respect to the sliding plate 64, to clamp the memory piece 64 through the locking cam plate 71 and the locking leaf spring 66. This push-button assembly 61 is supported freely slidable in the directions of the arrows A and B.

Figure 17:
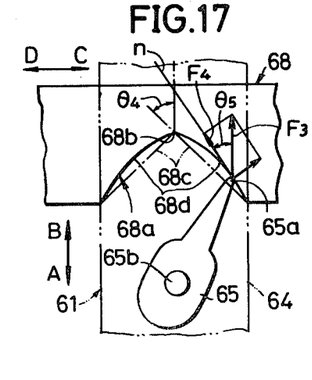
FIGS. 17 and 18 respectively are diagrams for indicating the operation of the memory piece and the cam plate of the push-button assembly of FIGS. 16A and 16B.
Figure 18:
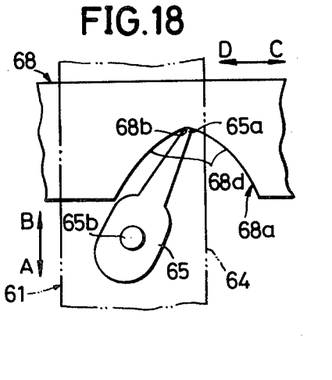

The cam plate 68 is freely slidable in the directions of the arrows C and D of FIGS. 17 and 18, and comprises a V-shaped cam portion 68a having a vertex 68b at a position respective of the push-button assembly 61. This V-shaped cam portion 68a has curvilinear V-shaped sides 68d which are obtained by curving the linear V-shaped sides 68c shown by the two-dot chain line in FIG. 17 outwards (designating the angle formed between the V-shaped side 68c and the directions of the arrows A and B by $\theta 4$, for example).

Accordingly, when the push-button assembly 61 is pushed in with a predetermined pushing force F3 upon finishing of the memory operation of the desired station, and when the contact portion 65a of the memory piece 65 makes contact with the right hand side curved side 68d of the V-shaped cam portion 68a in FIG. 17, an angle $\theta 5$ formed between a tangent n at the contact point on the curved side 68d with the directions of the arrows A and B becomes smaller than the angle $\theta 4$. Hence, in the present embodiment of the invention, the relationship between the memory piece 65 and the cam plate 68 is opposite to that in the above third embodiment of the invention, however, the principle of the operations are the same. Thus, the contact portion 65a then starts to move along the right hand side curve side 68d having a relatively large partial force F4 and (F4=F3 cos $\theta 5$), and the cam plate 68 starts to slide easily in the direction of the arrow C although a static friction larger than this partial force F4 is acting on the cam plate 68. Furthermore, the above partial force F4 becomes small when the contact portion 65a moves near the V-shaped vertex 68b, but since the kinetic friction of the cam plate 68 is small and an inertial force acts upon pushing of the push-button assembly 61 as in the above third embodiment of the invention, the cam plate 68 can easily slide. Therefore, as a result, the reading-out operation is completed when the contact portion 65a makes contact with the vertex 68b.

Further, this invention is not limited to these embodiments but various variations and modifications may be made without departing from the scope of the invention.

What is claimed is:

1. A push-button type tuning apparatus comprising: a frame;
   a plurality of push-button assemblies each having a push-button on one end thereof, and inserted into and supported by said frame, said push-button assembly being slidable in the pushing direction between a non-operational position and an operational position;
   a cam member provided on said frame, said cam member being slidable in a direction perpendicular to the pushing direction of said push-button assembly; and
   a tuner provided on said frame, said tuner being tuned according to the sliding quantity of said cam member,
   said push-button assembly further having a memory piece which has a V-shaped cam portion, said memory piece being rotatably supported in the vicinity of the open portion of said V-shaped cam portion in a state where the vertex of said V-shaped cam portion faces towards the direction of said push-button, and first locking means for locking said memory piece at a desired rotated position, p1 said cam member further having a projecting cam portion provided on the inner side of said V-shaped cam portion of said memory piece,
   said V-shaped cam portion of said memory piece which is in the locked state, making contact with and pushing against said projecting cam portion of said cam member upon sliding of said push-button assembly in the operational position, and guiding said projecting cam portion to said vertex of said V-shaped cam portion to slide said cam member in the perpendicular direction with respect to the pushing direction of said push-button assembly.

2. An apparatus as claimed in claim 1 in which said V-shaped cam portion of said memory piece has two sides formed thereof respectively curved outwards.

3. An apparatus as claimed in claim 1 in which said push-button assembly is assembled from a sliding member having said memory piece and said first locking means, and a push-button member having said push-button and said locking means, said sliding member and said push-button member respectively being relatively freely slidable with respect to each other, said push-button member and said sliding member initially sliding unitarily upon pushing operation of said push-button assembly,
   said push-button member sliding relatively with respect to said sliding member at said operational position, to effectively perform the engagement between said first and second locking means and lock said memory piece.

4. An apparatus as claimed in claim 3 in which one of said sliding member and said push-button member has a projection and the other has an opening for accommodating said projection, said opening further having a sloping edge to which said projection makes contact upon relative sliding of said sliding member and said push-button member, said sloping edge sloping at a predetermined angle respective to the perpendicular direction with respect to the pushing direction of said push-button assembly.

5. An apparatus as claimed in claim 1 in which said push-button assembly further comprises a leaf spring for urging said memory piece in the direction of a neutral position of rotary movement of said memory piece.

6. An apparatus as claimed in claim 1 in which said cam member is applied with a smooth material on the outer surfaces thereof.

7. An apparatus as claimed in claim 6 in which said smooth material is copper.

8. A push-button type tuning apparatus comprising: a frame;
   a plurality of push-button assemblies each having a push-button on one end thereof, and inserted into and supported by said frame, said push-button assembly being slidable in the pushing direction between a non-operational position and an operational position;
   a cam member provided on said frame, said cam member being slidable in a direction perpendicular to the pushing direction of said push-button assembly;
   a tuner provided on said frame, said tuner being tuned according to the sliding quantity of said cam member,
   manual tuning operation means provided on said frame, for sliding said cam member in the perpendicular direction with respect to the pushing direction by a manual operation;

clutch means provided on said frame, for selectively changing over to a transmitting state or a non-transmitting state to transmit or interrupt transmission of the operating force which is to be transmitted to said cam member from said manual tuning operation means; and clutch changeover means provided freely slidable in the direction perpendicular to the pushing direction on said frame, said clutch changeover means engaging to said clutch means upon sliding to said clutch changeover means along a predetermined direction to put said clutch means in said non-transmitting state, said push-button assembly being assembled from a sliding member and a push-button member which respectively are relatively freely slidable with respect to each other, said sliding member having a memory piece which has a V-shaped cam portion where said memory piece is rotatably supported in the vicinity of the open portion of said V-shaped cam portion in a state where the vertex of said V-shaped cam portion faces towards the direction of said push-button, and first locking means for locking said memory piece at a desired rotated position, said push-button member having said push-button and second locking means, said push-button member and said sliding member initially sliding untiarily upon pushing operation of said push-button assembly, said push-button member sliding relatively with respect to said sliding member at said operational position, to effectively perform the engagement between said first and second locking means and lock said memory piece, said cam member further having a projecting cam portion provided on the inner side of said V-shaped cam portion of said memory piece, said V-shaped cam portion of said memory piece which is in the locked state, making contact with and pushing against said projecting cam portion of said cam member upon sliding of said push-button assembly in the operational position, and guiding said projecting cam portion to said vertex of said V-shaped cam portion to slide said cam member in the perpendicular direction with respect to the pushing direction of said push-button assembly, one of said sliding member and said push-button member having a rotatable member which has a first cam portion rotatably supported thereon, and the other having a second cam portion for rotating said rotatable member, said rotatable member being rotated by said second cam portion to slide said clutch changeover means in said predetermined direction by said first cam portion, when said sliding member and said push-button member start to perform the relative sliding motion and said first locking means operates to temporarily lock said memory piece.

* * * * *